(12) United States Patent
Shih-Tsung

(10) Patent No.: US 7,054,164 B2
(45) Date of Patent: May 30, 2006

(54) MOUNTING DEVICE FOR INTERFACE CARD

(75) Inventor: Chen Shih-Tsung, Taipei (TW)

(73) Assignee: Shuttle Inc. (TW)

( * ) Notice: Subject to any disclaimer, the term of this patent is extended or adjusted under 35 U.S.C. 154(b) by 97 days.

(21) Appl. No.: 10/437,418

(22) Filed: May 12, 2003

(65) Prior Publication Data

US 2004/0047123 A1 Mar. 11, 2004

(51) Int. Cl.
H05K 7/14 (2006.01)
H05K 7/18 (2006.01)

(52) U.S. Cl. .............. 361/801; 361/754; 361/752; 361/797

(58) Field of Classification Search ........ 361/800–801, 361/759, 753, 752, 797, 825, 683–684, 740, 361/732, 726, 747, 754; 211/41.17
See application file for complete search history.

(56) References Cited

U.S. PATENT DOCUMENTS

| | | | |
|---|---|---|---|
| 5,601,349 A | 2/1997 | Holt | |
| 6,231,139 B1 * | 5/2001 | Chen | 312/223.2 |
| 6,278,614 B1 | 8/2001 | Beaman et al. | |
| 6,442,038 B1 | 8/2002 | Erickson et al. | |
| 6,487,089 B1 | 11/2002 | Otis | |
| 6,549,398 B1 * | 4/2003 | Chen | 361/683 |
| 6,608,765 B1 * | 8/2003 | Vier et al. | 361/801 |
| 6,618,263 B1 | 9/2003 | Kin-Wing et al. | |
| 6,618,264 B1 | 9/2003 | Megason et al. | |
| 6,625,034 B1 * | 9/2003 | Davis et al. | 361/759 |
| 6,639,151 B1 * | 10/2003 | Chen et al. | 174/65 R |
| 6,704,205 B1 | 3/2004 | Chen | |
| 6,937,467 B1 * | 8/2005 | Hsu | 361/686 |
| 6,960,720 B1 * | 11/2005 | Wen-Lung | 174/50 |
| 2002/0075638 A1 * | 6/2002 | Chen | 361/683 |
| 2004/0037048 A1 * | 2/2004 | Liao | 361/726 |

* cited by examiner

Primary Examiner—Kamand Cuneo
Assistant Examiner—Hung S. Bui
(74) Attorney, Agent, or Firm—Fenwick & West LLP

(57) ABSTRACT

A mounting device for an interface card includes a main unit housing and a holding plate. The holding plate is rotatably coupled to the main unit housing and positionable in an open position to allow an interface card to be installed, and in a closed position to secure an interface card. When an interface card is installed into a socket on the motherboard of the computer, a portion of an attach plate of the interface card extends between the locating plate and the holding plate, thereby securing the interface card. The attach plate of the interface card may also extend through a lower opening of the housing, which receives therethrough a portion of the card's attach plate.

16 Claims, 3 Drawing Sheets

MOUNTING DEVICE FOR INTERFACE CARD

CROSS REFERENCE TO RELATED APPLICATIONS

This application claims the right of priority based on Taiwan application serial no. 091206816, filed on May 14, 2002, which is herein incorporated in its entirety by reference.

BACKGROUND

1. Field of the Invention

The present invention relates to mounting an interface card within a computer housing, and particularly to mounting an interface card quickly and easily while maintaining reliability of the connection and allowing for a lower profile.

2. Background of the Invention

In current practice, computers often need to be coupled to other external peripheral devices, such as monitors, modems, and sound output devices, for performing various functions related to those devices. This coupling is commonly performed by way of an interface card, which is inserted into a socket on the computer's motherboard. The interface board is further connected to an external device through an elongated opening in the housing of the computer's main unit. This opening in the housing corresponds to the socket so that, when an interface card is installed in the socket, the card is accessible to the outside of the housing. Once an interface card is inserted into a socket in the motherboard, the attach plate of the interface card is located at the corresponding opening in the housing and blocks the opening. The attach plate further provides the phycial and electrical interface with the peripheral device. When no card is installed, a baffle plate is typically used to cover the corresponding opening, thus protecting the motherboard and other components inside the computer housing as well as shielding these components. Accordingly, the baffle is removed before a card is installed.

Described above is a conventional design for existing computers. Typically, such interfaces are governed by commonly used standards. Widely used specifications for such interface cards include PCI (Peripheral Component Interconnection), AGP (A Gateway Protocol, and ISA (Industrial Standard Architecture). Typical PCI cards, for example, include network cards, data cards, sound effect cards, video cards and the like.

Mounting schemes for interface cards vary; however, existing systems suffer from the drawback that they are difficult, labor-intensive, and/or time-consuming to employ. It is desirable to have a mounting device for one or more interface cards in a computer that allow for quick and easy installation thereof. Further, the reliability of the electrical signal carried by the interface card is affected by the connection made between the interface card and the socket, and it is desirable to maintain a reliable connection therebetween. Also, in some applications (such as low-profile, compact computers), it is desirable to mount the interface card low inside the computer housing, allowing the housing to have a lower profile.

SUMMARY OF THE INVENTION

Accordingly, in one embodiment of the present invention, a mounting device for an interface card includes a main unit housing and a holding plate. The main unit housing includes a housing wall, which has a lateral opening corresponding to an interface card and allowing access thereto, a transverse opening, and a locating plate extending from the housing wall along an edge of the transverse opening. A holding plate is rotatably coupled to the main unit housing. This holding plate is positionable in an open position to allow an interface card to be installed, and further positionable in a closed position to secure an interface card. When an interface card is installed into a socket on the motherboard of the computer, a portion of an attach plate of the interface card extends between the locating plate and the holding plate, thereby securing the interface card. Accordingly, this provides a quick and easy mechanism for securing an interface card when installed into a computer.

In another embodiment, the attach plate of the interface card extends through a lower opening of the housing. This lower opening receives therethrough a portion of the card's attach plate, thereby lowering the position inside the housing that the interface card sits. This, in turn, allows for a lower profile housing, and ultimately, a smaller computer main unit. This lower opening also contributes to the stability and security of an interface card installed in the computer.

The novel features of the invention are set forth with particularly in the appended claims. The invention is best understood from the following written description when read in conjunction with the accompanying drawings.

DETAILED DESCRIPTION OF THE PREFERRED EMBODIMENTS

Figure 1:
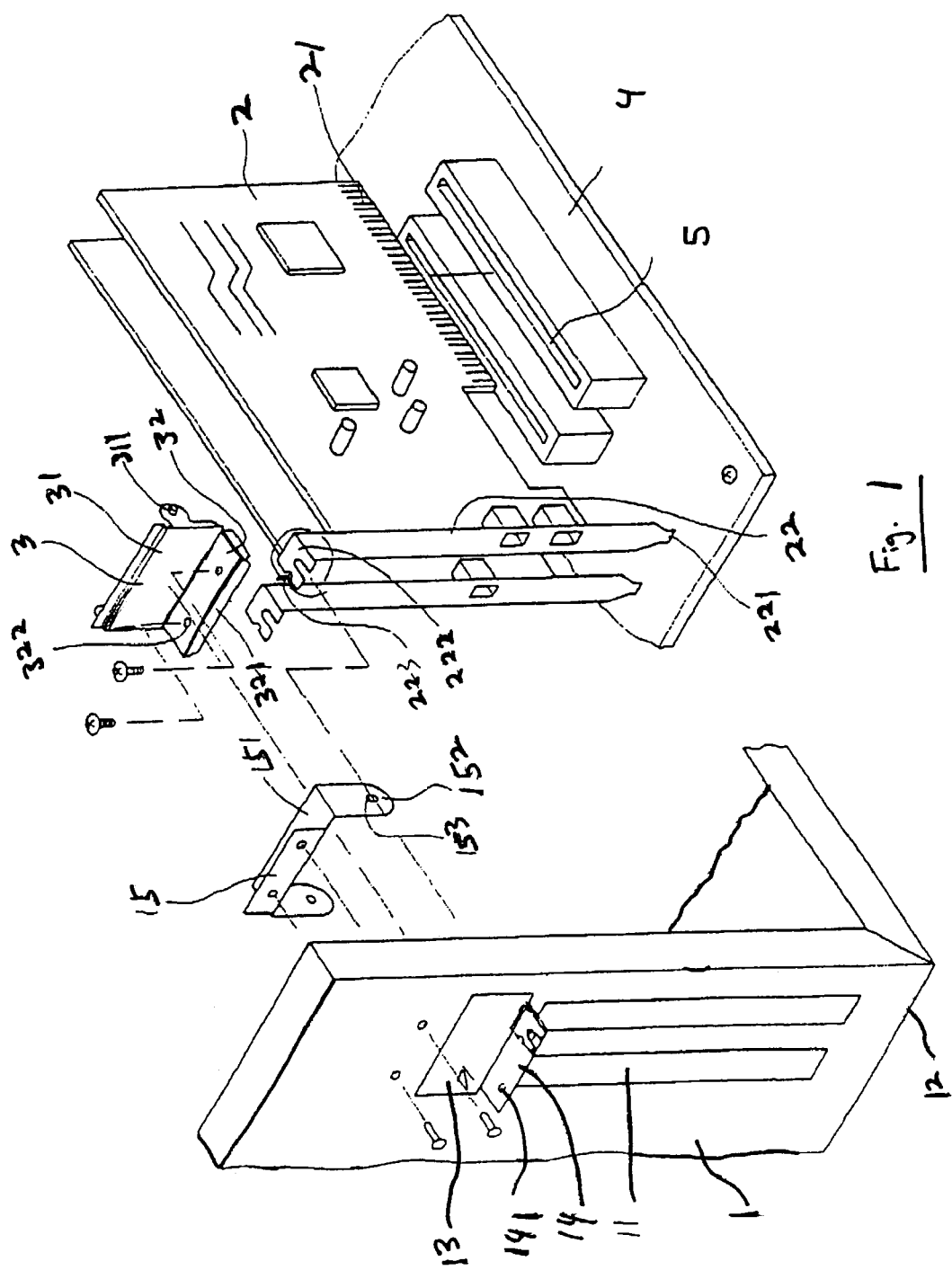
FIG. 1 is a disassembled perspective view of a the installation of an interface card 2 in accordance with an embodiment of the present invention.
Figure 2:
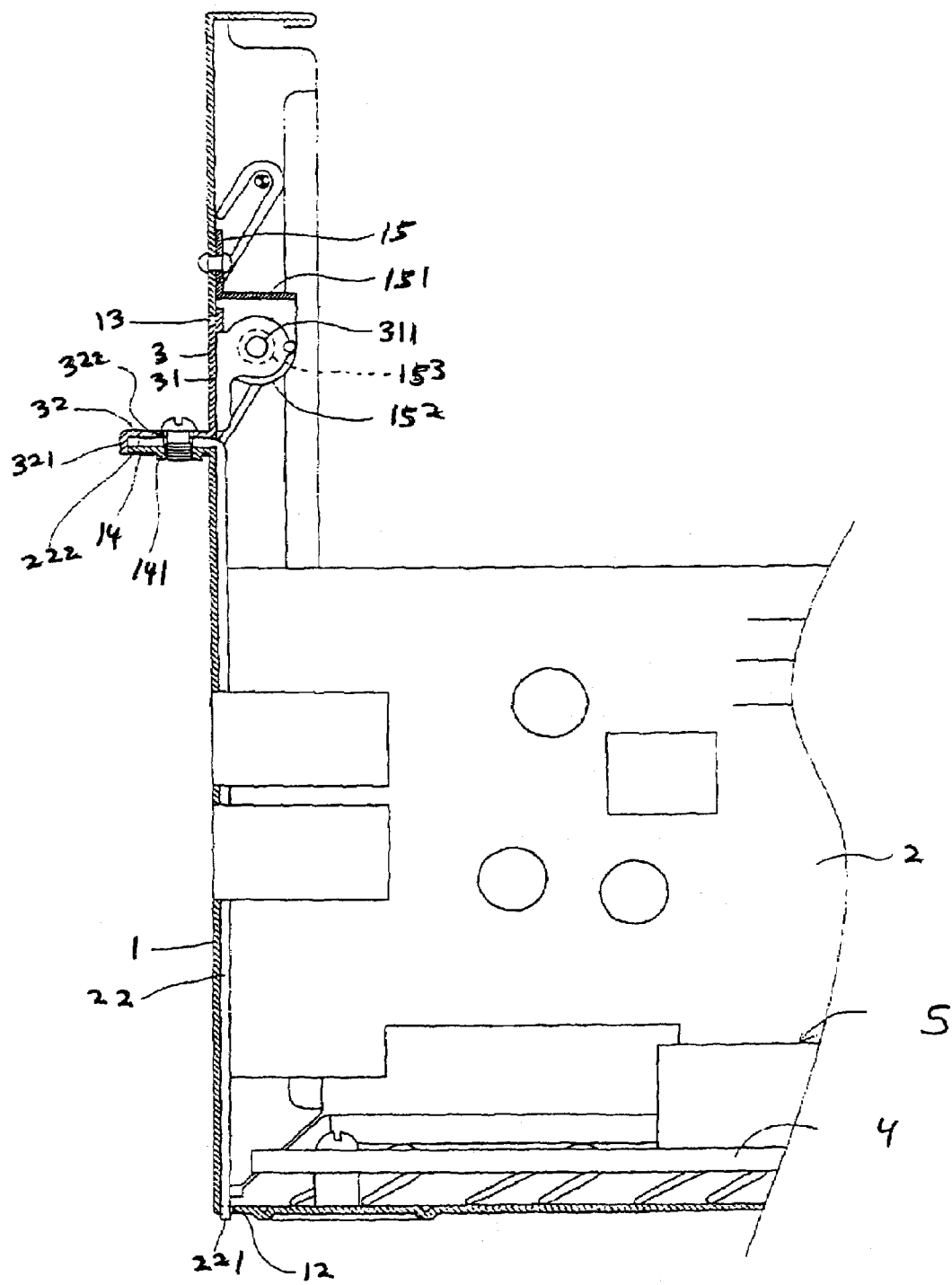
FIG. 2 is a partial cross-sectional view of FIG. 1, after being assembled.
Figure 3:
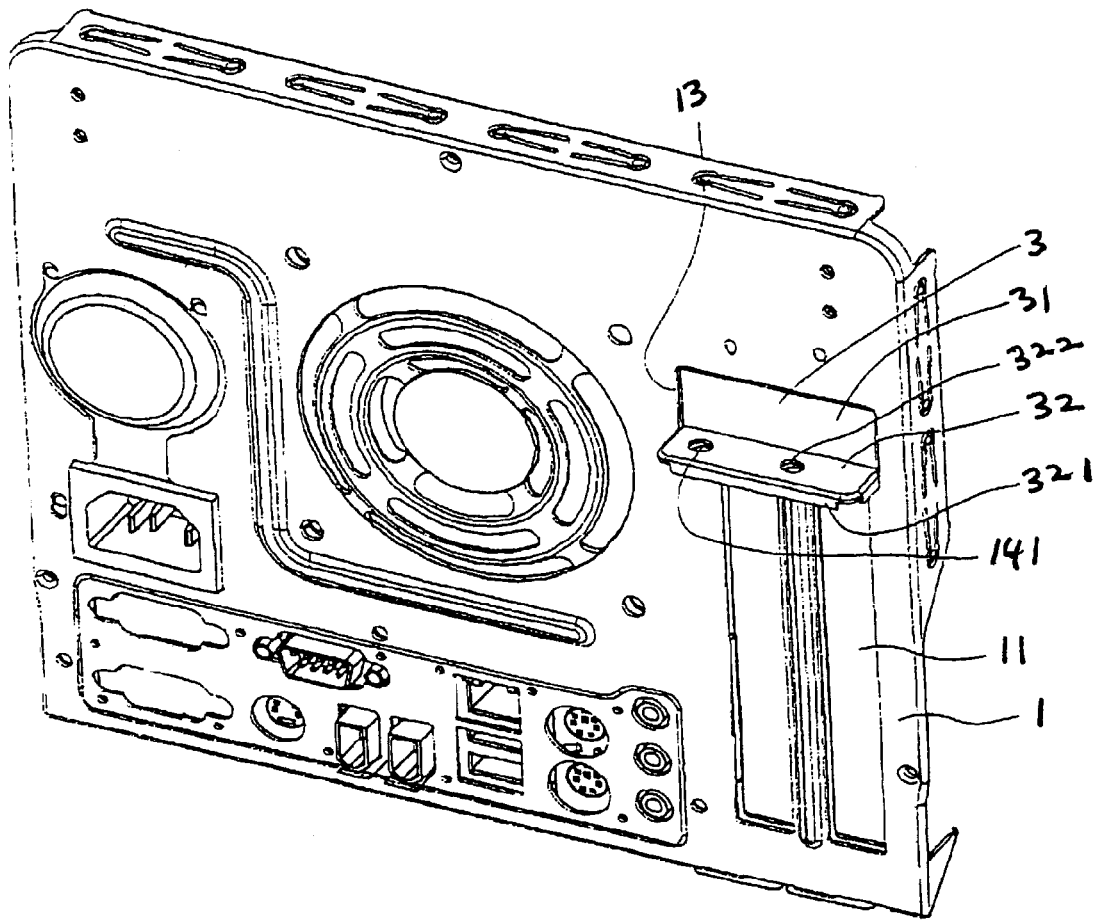
FIG. 3 is a perspective view of the computer main unit.

FIGS. 1 through 3 illustrate a mounting device for an interface card in accordance with the present invention. The invention is described in terms of a conventional interface card 2, which can be for example a network card, a data card, a video card, or the like. A typical interface card 2 includes a plurality of connection pins 21 for being inserted into a socket 5 on the motherboard 4. The interface card 2 further includes an attach plate 22, which provides a physical interface between the card 2 and the computer housing 1. The attach plate 22 has a size and shape corresponding to the opening 11. On this attach plate 22 are included one or more external terminals 23 to which external devices can be connected. Additionally, the attach plate 22 may include an end 221 projecting towards the motherboard 4, which is used to contribute to the stability of the attach plate 22 (e.g., to stabilize the attach plate 22 when an external device is plugged into the card 2). Similarly, the opposite end of the attach plate 22 includes a folded plate 222. Further, the folded plate 222 is provided with a hole or recess 223.

The housing 1 is used to contain the motherboard 4 and other internal components of the computer. The housing 1 is formed with an opening 11 that allows access to an installed interface card 2. The opening 11 corresponds to the interface card, typically elongated and upright as shown in the drawings. Two upright openings 11 are provided in the embodiment of FIG. 1.

A transverse opening 13 is disposed above or proximate to the opening 11, wherein a holding plate 3 can move within the transverse opening 13 so as to allow an interface card 2 to be installed and then secured. A locating plate 14 extends from the housing 1 along at least a portion of an edge of the transverse opening 13. The locating plate 14 is provided to secure the folded plate 222 of the interface card 2, and in one embodiment the locating plate 14 includes engaging holes 141 corresponding the opening 11 for fastening to the folded plate 222 of the interface card 2.

A holding plate 3 is provided for securing the card 2 in place. In one embodiment, the holding plate 3 is substantially L-shaped, as shown in the drawings. The holding plate 3 may be sized and shaped corresponding to the transverse opening 13 to cover the opening and thereby protect and shield the internal components. The holding plate 3 includes an upright baffle plate 31 with the upper lateral sides thereof protruding a projection piece 311. To allow the holding plate to rotate within the transverse opening 13, a joining plate 15 is fixed to a wall of the housing 1 above or proximate to the transverse opening 13. In one embodiment, the joining plate 15 includes a flat plate 151 and a lug 152 extending from the flat plate 151 at two lateral sides thereof. Each lug includes a hole 153 for being connected to a holding plate 3. Accordingly, the projection piece 311 of the holding plate 3 corresponds to the joining plate 15 to fit with the axial hole 153 at the respective lug 152, allowing the holding plate 3 to move rotationally in the transverse opening 13. In other embodiments, other known techniques for rotationally mounting the holding plate 3 to the housing 1 can be used without departing from the scope of the invention.

The holding plate 3 further includes a horizontal engaging plate 32 that extends from the bottom of the holding plate 3. In one embodiment, the edge of engaging plate 32 has a downward engaging edge 321 for covering the locating plate 14. In addition, the engaging plate 32 has a hole 322 corresponding to the hole 141 of the locating plate to allow a fastener to be inserted therethrough. In this way, an interface card 2 can be fixedly attached to the main unit housing 1 by way of a screw passing through the engaging hole 322, the plate recess 223, and the engaging hole 141 and fastening to the locating plate 14.

An interface card 2 is installed in a computer by inserting its connecting pins 21 into the socket 5 of the motherboard 4. When the card 2 is inserted into the socket 4, the attach plate 22 of the interface card 2 is located so that the attach end 221 of the attach plate 22 is inserted through the lower slit 12. This helps to stabilize the card 2 and allows the interface card 2 to sit lower within the housing 1, in turn allowing for a lower profile housing. Moreover, the folded plate 222 at the top of the attach plate 22 fits against the locating plate 141 so that the plate recess 223 is aligned with the engaging hole 141. The attach plate 22 also serves to block the longitudinal opening 11. After the interface card 2 is inserted thusly, the holding plate 3 is turned downward so that the engaging plate 32 is located over the folded plate 222 with the engaging edge 321 covering the locating plate 14. In this position, a screw, pin, or other suitable fastener can be used to secure the card 2 in place by passing it through the plate hole 322, the plate recess 223, and the engaging hole 141.

The rotatable holding plate 3 thus allows for easy installation of an interface card 2. The holding plate 3 rotates out of a securing position to allow the card 2 to be inserted, and then rotates back to the securing position to block the transverse opening 13 and hold the folded plate 222 of the card 2 and the locating plate 14 of the housing 1 so as to prevent the attach plate 22 (and thus the card 2) from lifting up. This keeps the interface card 2 and prevents it from escaping from the socket 5 on the motherboard 4. Hence, the firmness and reliability of the interface is maintained to ensure stability of the signal, while allowing for easy installation of cards 2.

In one aspect of an embodiment, the housing further includes a lower opening 12, which corresponds to a socket 5 and is shaped to allow the end 221 of the attach plate 22 of an inserted interface card 2 to extend through lower opening 12 and thus out of the bottom of the housing 1. Accordingly, an interface card 2 is installed into a socket 5 of a computer's motherboards 4 such that the lower end 221 of the attach plate 22 passes through lower slits 12 in the main unit housing 1. To avoid contact between the ground and the attach plate 22, the attach plate 22 may extend above any foot pads of the computer. In this way, it is possible to lower the gross height of the main unit housing 1, thus enabling a lower profile computer.

The foregoing description of the embodiments of the invention has been presented for the purposes of illustration and description. It is not intended to be exhaustive or to limit the invention to the precise forms disclosed. Persons skilled in the relevant art can appreciate that many modifications and variations are possible in light of the above teaching. It is therefore intended that the scope of the invention be limited not by this detailed description, but rather by the claims appended hereto.

I claim:

1. A mounting device for an interface card, the mounting device comprising:
    a main unit housing having a lateral opening and a transverse opening through a wall of the housing, the lateral opening allowing access to an installed interface card;
    a locating plate extending from the housing along at least a portion of an edge of the transverse opening; and
    a holding plate rotatably coupled to the main unit housing, the holding plate positionable in an open position to allow an interface card to be installed, the holding plate further positionable in a closed position to secure an interface card;
    wherein the locating plate and the holding plate contain aligned holes for receiving a fastener to an interface card.

2. The mounting device of claim 1, wherein, when an interface card is installed, a portion of an attach plate of the interface card extends between the locating plate and the holding plate, thereby securing the interface card.

3. The mounting device of claim 1, wherein the holding plate includes a baffle plate section, the baffle plate section of the holding plate covering the transverse opening of the housing wall when the holding plate is in a closed position.

4. The mounting device of claim 1, further comprising:
    a means for rotatably coupling the holding plate to the main unit housing.

5. The mounting device of claim 1, wherein the holding plate is substantially L-shaped.

6. The mounting device of claim 1, wherein the housing wall includes a second lateral opening corresponding to an interface card, and the locating plate and the holding plate are adapted to secure at least two interface cards.

7. The mounting device of claim 1, further comprising:
    a joining plate fixed to the housing wall, the joining plate rotatably coupled to the holding plate.

8. The mounting device of claim 1, wherein the holding plate includes a downward engaging edge thereof to cover the locating plate when in a closed position.

9. A mounting device for an interface card, the mounting device comprising:
- a main unit housing having a lateral opening and a transverse opening through a wall of the housing, the lateral opening allowing access to an installed interface card, the main unit housing further including a lower opening for receiving therethrough a portion of an attach plate of an interface card;
- a locating plate extending from the housing along at least a portion of an edge of the transverse opening; and
- a holding plate rotatably coupled to the main unit housing, the holding plate positionable in an open position to allow an interface card to be installed, the holding plate further positionable in a closed position to secure an interface card.

10. The mounting device of claim 9, wherein, when an interface card is installed, a portion of an attach plate of the interface card extends between the locating plate and the holding plate, thereby securing the interface card.

11. The mounting device of claim 9, wherein the holding plate includes a baffle plate section, the baffle plate section of the holding plate covering the transverse opening of the housing wall when the holding plate is in a closed position.

12. The mounting device of claim 9, further comprising:
- a means for rotatably coupling the holding plate to the main unit housing.

13. The mounting device of claim 9, wherein, the holding plate is substantially L-shaped.

14. The mounting device of claim 9, wherein the housing wall includes a second lateral opening corresponding to an interface card, and the locating plate and the holding plate are adapted to secure at least two interface cards.

15. The mounting device of claim 9, further comprising:
- a joining plate fixed to the housing wall, the joining plate rotatably coupled to the holding plate.

16. The mounting device of claim 9, wherein the holding plate includes a downward engaging edge thereof to cover the locating plate when in a closed position.

* * * * *

UNITED STATES PATENT AND TRADEMARK OFFICE
CERTIFICATE OF CORRECTION

| | | |
|---|---|---|
| PATENT NO. | : 7,054,164 B2 | Page 1 of 1 |
| APPLICATION NO. | : 10/437418 | |
| DATED | : May 30, 2006 | |
| INVENTOR(S) | : Cheng Shih-Tsung | |

It is certified that error appears in the above-identified patent and that said Letters Patent is hereby corrected as shown below:

On the Title page Item [30], please add --Foreign Application Priority Data – May 14, 2002  TW  91206816--; and At column 6, line 6, please insert a space after "wherein".

Signed and Sealed this

Twelfth Day of December, 2006

JON W. DUDAS
*Director of the United States Patent and Trademark Office*